(12) United States Patent
Aurongzeb et al.

(10) Patent No.: US 8,373,181 B2
(45) Date of Patent: Feb. 12, 2013

(54) METHOD AND DEVICE FOR A CATHODE STRUCTURE FOR FLEXIBLE ORGANIC LIGHT EMITTING DIODE (OLED) DEVICE

(75) Inventors: Deeder Mohammad Aurongzeb, Mayfield Heights, OH (US); Christian Maria Anton Heller, Munich (DE)

(73) Assignee: General Electric Company, Schenectady, NY (US)

( * ) Notice: Subject to any disclaimer, the term of this patent is extended or adjusted under 35 U.S.C. 154(b) by 58 days.

(21) Appl. No.: 13/172,313

(22) Filed: Jun. 29, 2011

(65) Prior Publication Data
US 2013/0001598 A1    Jan. 3, 2013

(51) Int. Cl.
*H01L 29/18* (2006.01)
(52) U.S. Cl. ............. 257/88; 257/89; 257/98; 257/99; 438/22
(58) Field of Classification Search ............. 257/88, 257/89, 98, 99; 438/22
See application file for complete search history.

(56) References Cited

U.S. PATENT DOCUMENTS

| | | |
|---|---|---|
| 5,022,930 A | 6/1991 | Ackerman et al. |
| 5,821,692 A | 10/1998 | Rogers et al. |
| 5,952,778 A | 9/1999 | Haskal et al. |
| 7,198,533 B2 | 4/2007 | Duggal et al. |
| 2003/0141807 A1 | 7/2003 | Kawase |
| 2003/0158294 A1 | 8/2003 | Chaudhuri et al. |
| 2004/0142206 A1 | 7/2004 | Bazan et al. |
| 2004/0247949 A1 | 12/2004 | Akedo et al. |
| 2005/0285518 A1 | 12/2005 | Cok |

OTHER PUBLICATIONS

PCT Search Report and Written Opinion dated Sep. 19, 2012 from corresponding Application No. PCT/US2012/044278.
Lewis, J. S. et al., "Thin-Film Permeation-Barrier Technology for Flexible Organic Light-Emitting Devices", vol. 10. No. 1, pp. 45-57, Jan. 1, 2004.
Seung Hoon Han et al., "63.3: High Resolution OTFT-OLED on Plastic Substrate Using Self-organized Process", vol. XXXVIII, pp. 1757-1759, May 20, 2007.
Lian Duan et al., "Improved flexibility of flexible organic light-emitting devices by using a metal/organic multilayer cathode; Improved flexibility of flexible organic light-emitting devices", Journal of Physics D. Applied Physics, vol. 42, No. 7, pp. 75103, Apr. 7, 2009.
Nakajima et al., "Fabrication of 5.8-in. OTFT-driven flexible color AMOLED display using dual protection scheme for organic semiconductor patterning", SID Journals, May 13, 2009.

*Primary Examiner* — Tan N Tran
(74) *Attorney, Agent, or Firm* — GM Global Patent Operation; Peter T. DiMauro

(57) ABSTRACT

A method for making a flexible OLED lighting device includes forming a plurality of OLED elements on a flexible planar substrate, wherein at least one of the OLED elements includes a continuous respective anode layer formed over the substrate, one or more organic light emitting materials formed over the anode layer, a cathode layer formed over the light emitting materials, and an encapsulating protective cover formed over the cathode layer. At least one of the OLED elements defines a continuous light region on the substrate, wherein the substrate and combination of OLED elements define an active light area. The active light area is bendable from a flat planar configuration to a bend configuration having a design bending radius. The thickness of the cathode layer is formed between a minimum thickness value and a maximum thickness value as a function of the size of the active light area and the design bending radius. An OLED in accordance with these aspects is also provided.

19 Claims, 4 Drawing Sheets

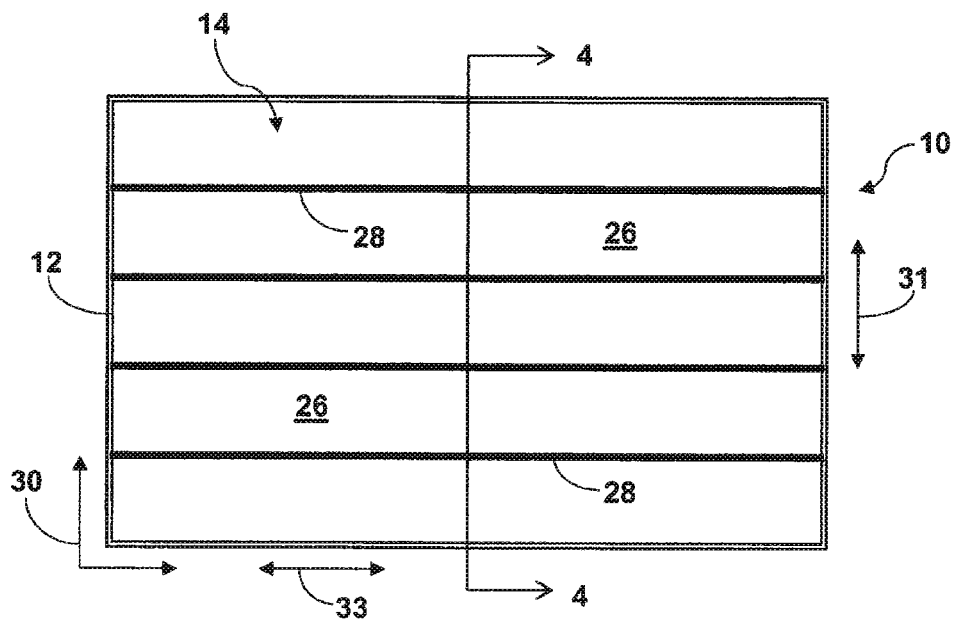
*Fig. -1-*
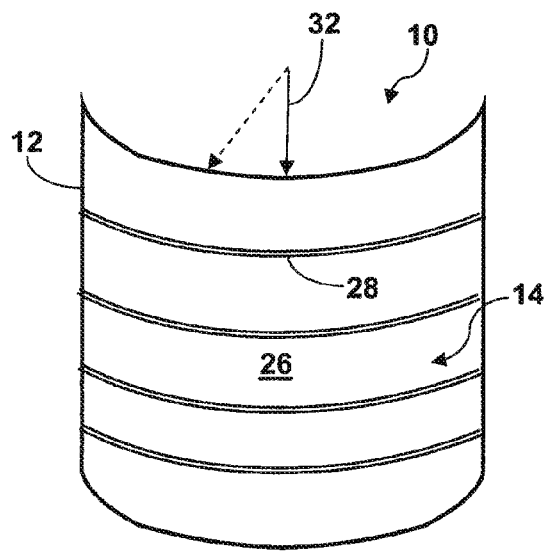
*Fig. -2-*
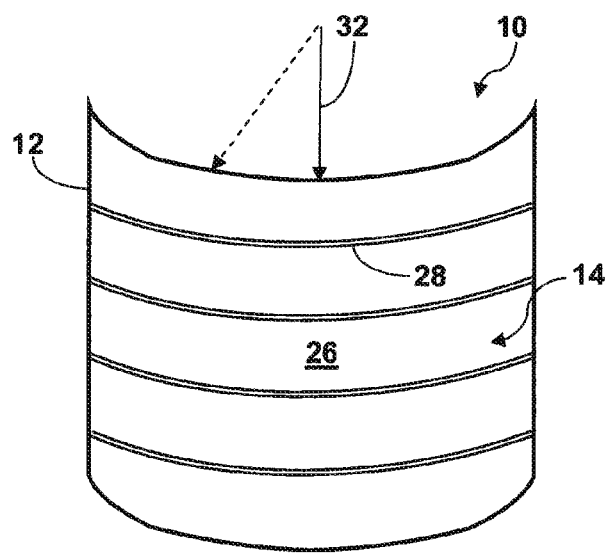
*Fig. -3-*

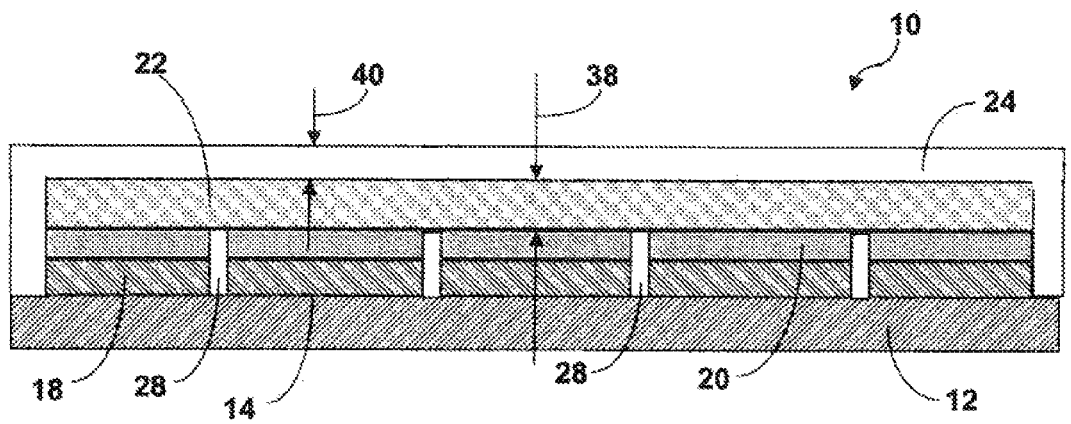
Fig. -4-
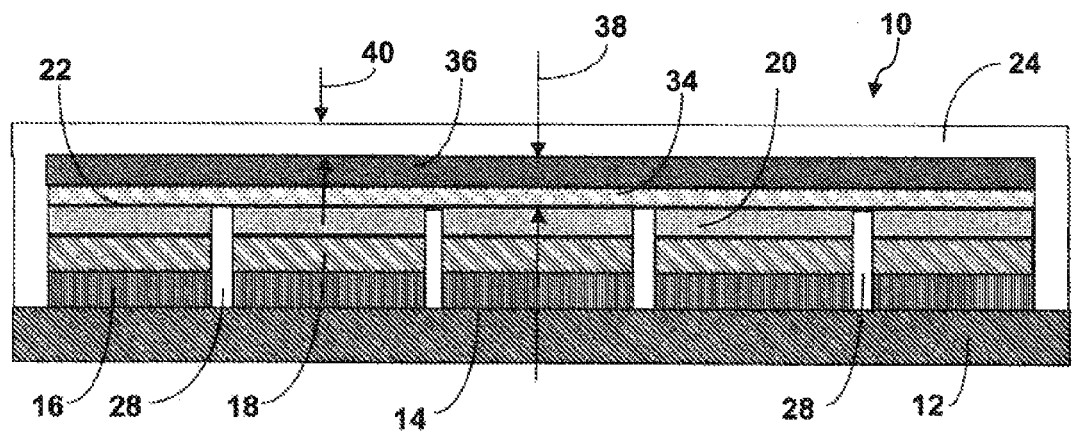
Fig. -5-

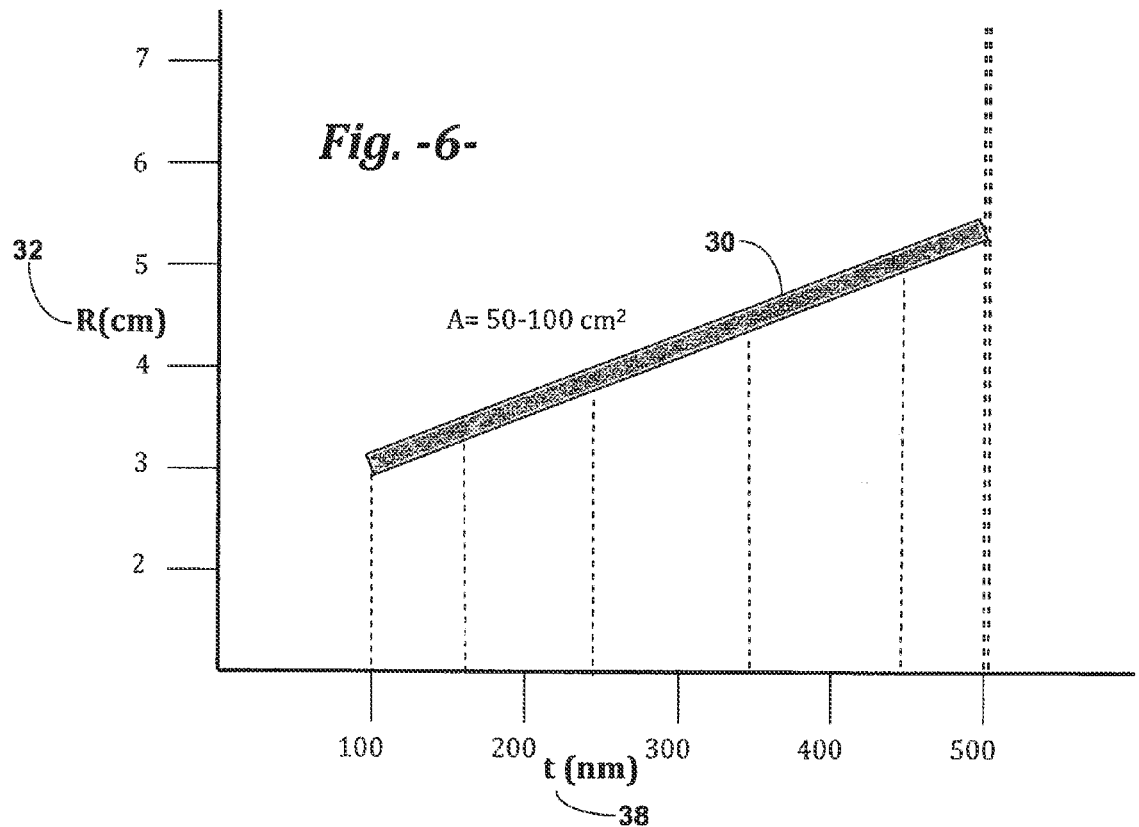
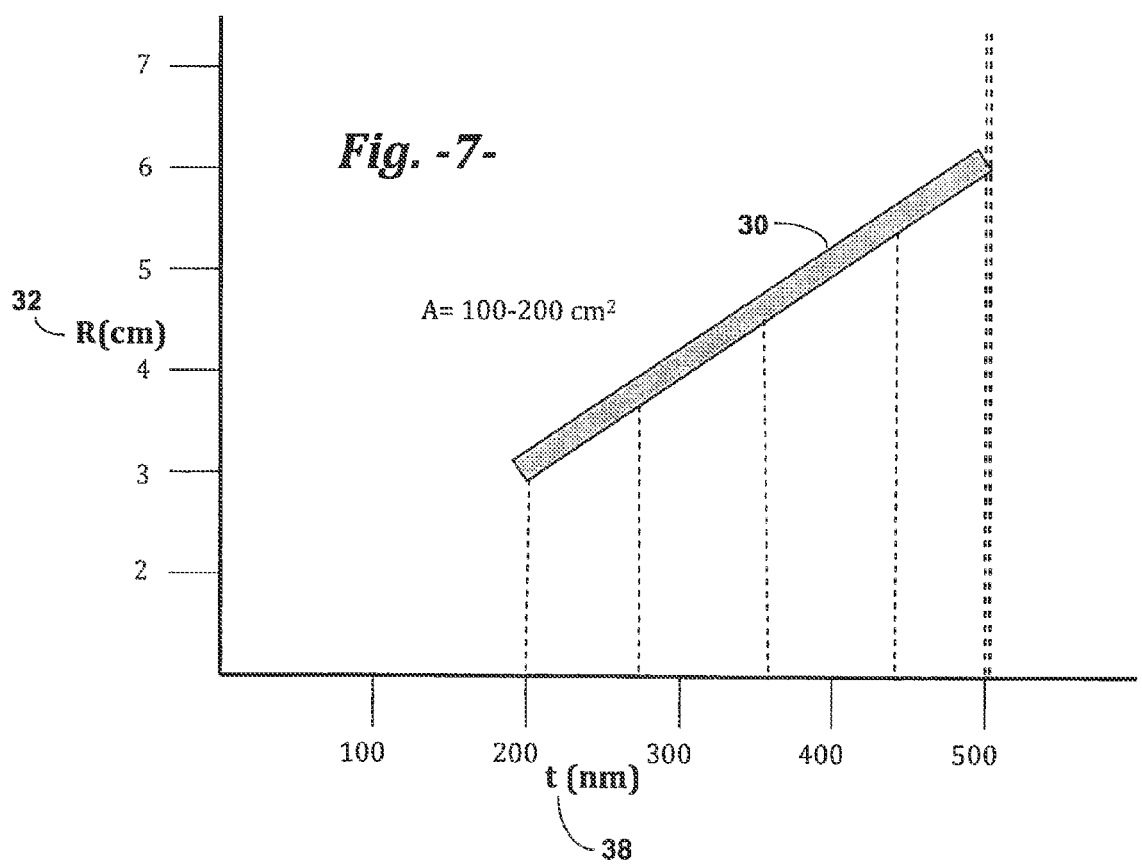

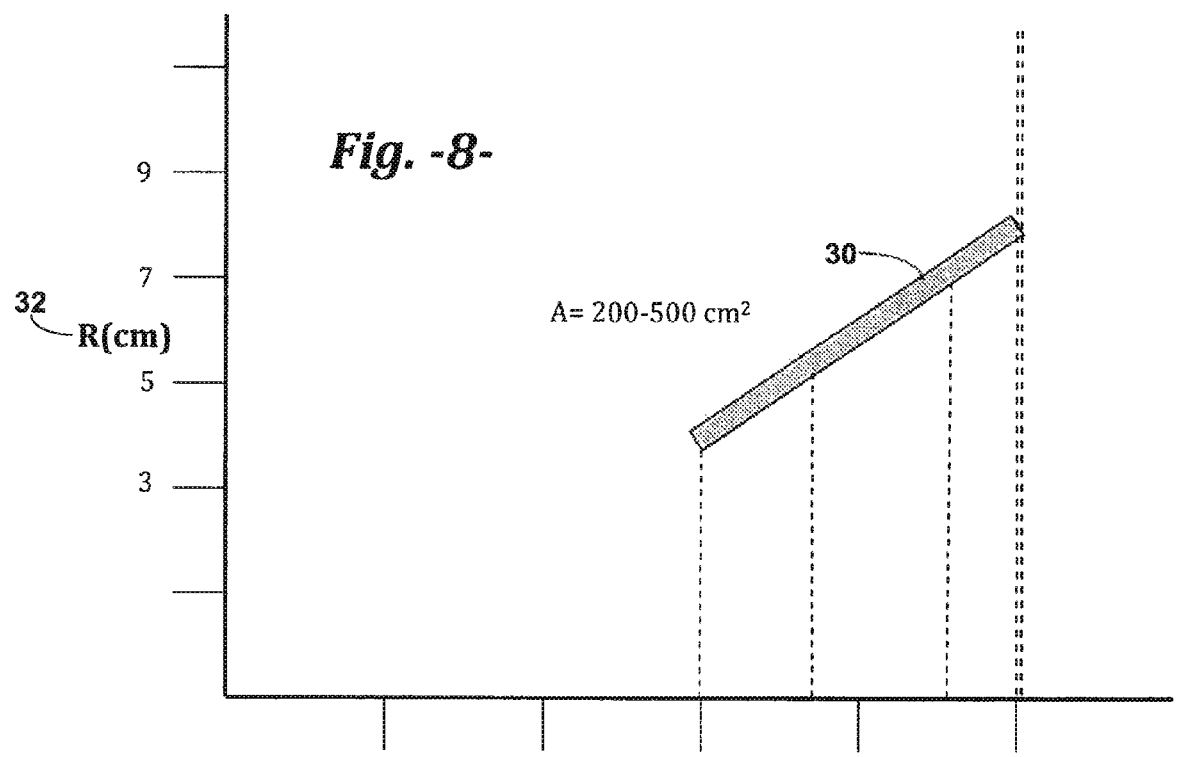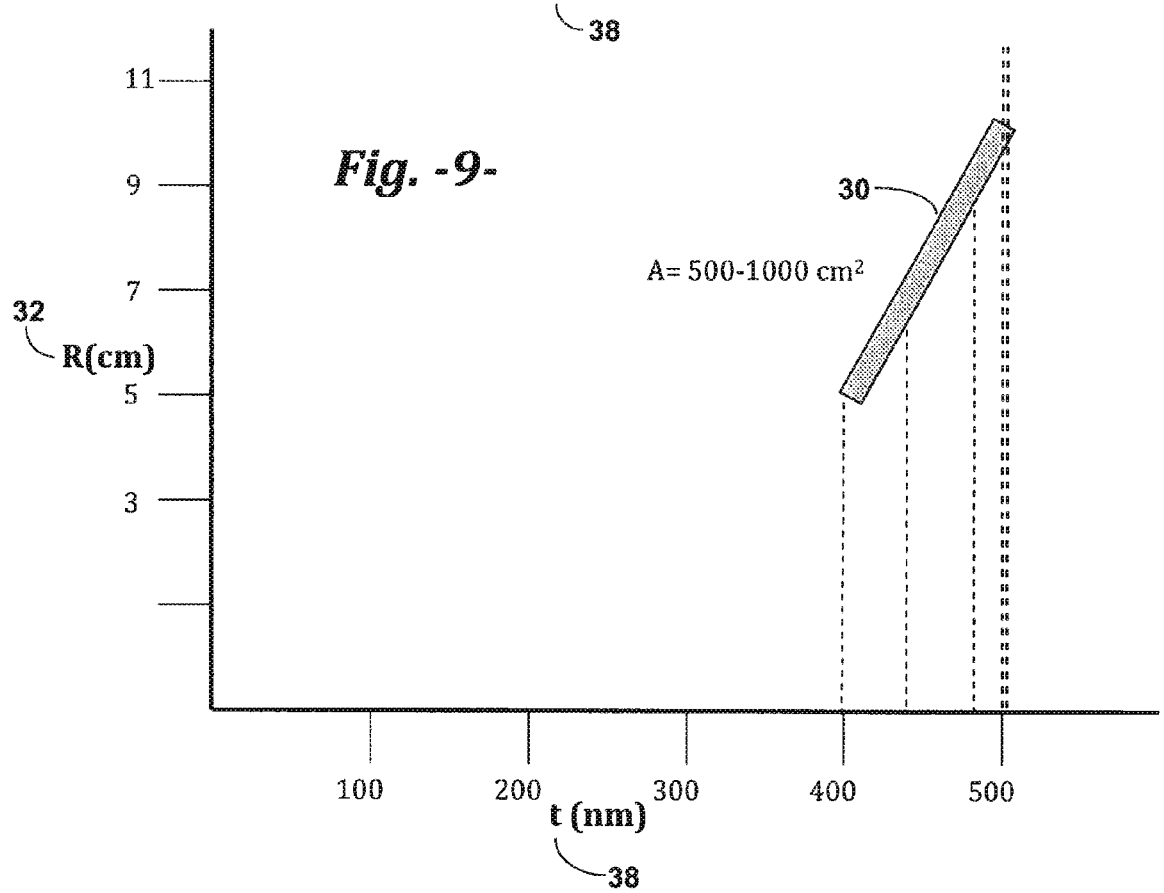

METHOD AND DEVICE FOR A CATHODE STRUCTURE FOR FLEXIBLE ORGANIC LIGHT EMITTING DIODE (OLED) DEVICE

BACKGROUND OF THE INVENTION

1. Field of the Invention

The field of the invention relates generally to organic light emitting diode (OLED) devices, and more particularly to a cathode structure in a flexible OLED device.

2. Description of Related Art

Organic electroluminescent devices, such as organic light emitting diodes (OLEDs), have been widely used for display applications, and the use of such devices in general lighting applications is gaining acceptance. An OLED device includes one or more organic light emitting layers disposed between two electrodes, e.g., a cathode and an anode, formed on a substrate. An encapsulating cover is disposed over the cathode. The OLED device may "top-emitting", wherein the produced light is emitted through the cover, or "bottom-emitting" wherein the produced light is emitted through the substrate. The organic light emitting layer emits light upon application of a voltage across the anode and cathode, whereby electrons are directly injected into the organic layer from the cathode, and holes are directly injected into the organic layer from the anode. The electrons and the holes travel through the organic layer until they recombine at a luminescent center. This recombination process results in the emission of a photon, i.e., light.

Large area OLED devices typically combine many individual OLED elements on a single substrate. Use of large area OLED devices as a light source in lighting fixtures is gaining acceptance in the lighting industry. OLED devices, which typically have an Al/Ag cathode structure and a thickness of less than 200 nm, are an efficient, high-brightness light source, but are not without certain inherent drawbacks. The devices generate significant internal heat, which can be dissipated in larger area devices, but also operate in high temperature environments. Prolonged exposure to high temperatures may induce localized degradation of the devices (e.g., de-lamination of the light-emitting layers), often resulting in color shift and/or highly visible dark spots in the illumination field. High temperatures also result in an overall decrease in brightness of the device, thus limiting the useful life of the devices.

One approach to improving heat management and cooling an OLED device is set forth in published U.S. Pat. Application No. 2005/0285518, which proposes a "thick" cathode configuration. The cathode has a continuous thickness of greater than 500 nm over and between the light emitting elements, and is preferably greater than 10 microns. The '518 publication also proposes to add a heat conductive layer to the cathode cover, with this layer preferably having a thickness of at least 100 microns. A premise of the '518 publication is that a cathode below 500 nm thickness will not provide sufficient heat conductivity, and that a "thick" cathode and thermally conductive cover are needed.

Flexible OLED devices are formed with flexible substrates of metal foils, plastic films, and the like, and offer certain advantages. These devices are lightweight, durable, and impact resistance. Their use in lighting applications and displays for cell phones, PDAs, portable computers, and so forth, is gaining wider acceptance. The flexible OLED devices are, however, subject to the same high temperature issues discussed above, in addition to the increased stresses in the light emitting materials resulting from bending or twisting the OLED devices. The solution proposed by the '518 publication discussed above is not suitable for flexible OLED devices because the increased thickness cathode and protective cover configuration only adds to the bending stresses and would likely induce cracking and delamination in the underlying layers.

Therefore, a need exists in the industry for an improved cathode structure and cathode protection layer particularly suited for flexible OLED devices that operate in high temperature environments.

BRIEF SUMMARY OF THE INVENTION

Aspects and advantages of the invention will be set forth in part in the following description, or may be obvious from the description, or may be learned through practice of the invention.

For example, embodiments of the invention provide an OLED lighting device that is flexible or bendable, and which is capable of operating in high temperatures, e.g., above about 40 C. Since embodiments of such OLED devices are flexible, they may be mounted to any manner of curved support surface, such as a pole, curved wall or platform, a curved frame member, any type of non-flat fixture, and so forth. Accordingly, such flexible OLED lighting devices are significantly more versatile than rigid OLED lighting devices. Flexible OLED devices in accordance with embodiments of the present invention have a unique combination of characteristics that provide for heat management of the devices without inhibiting or limiting flexibility of the devices. Characteristics of the OLED lighting devices are tailored to the intended bend configuration and active light area of the devices so as to provide sufficient heat management without unnecessarily limiting or inhibiting flexibility.

In accordance with aspects of the invention, a method for making a flexible OLED lighting device comprises forming a plurality of OLED elements on a flexible planar substrate. The OLED elements include a continuous respective anode layer formed over the substrate. One or more organic light emitting materials are formed over the anode layer. A cathode layer is formed over the light emitting materials, and an encapsulating protective cover is formed over the cathode layer. At least one of the OLED elements defines a continuous light region on the substrate and, in particular embodiments, the substrate and OLED elements have an active light area of 50 $cm^2$ or greater. The device is formed such that the active light area is bendable from a flat planar configuration into a three-dimensional bend configuration at a given design bending radius. The method further comprises forming the thickness of the cathode layer as a function of the size of the active light area and the design bending radius. Thus, the cathode layer thickness is essentially a compromise between the heat management issues related to active area size and rigidity that affects the bending potential of the device (without resulting in delamination or other damage to the device).

In a particular embodiment, for a given size of the active light area, the cathode layer thickness is defined between a minimum thickness value (at a maximum bend configuration) and a maximum value as a function of an increasing design bending radius. For example, the maximum thickness value may be less than 500 nm, while the minimum thickness value is at least 100 nm at a maximum bend configuration (e.g., at a design bending radius of 3 cm).

The design bending radius may be a function of various factors, including the size of the active light area. In a particular configuration, the design bending radius is 3 cm at the maximum bend configuration of the OLED.

In various different method embodiments, wherein for a given design bending radius of 3 cm or greater, the cathode layer thickness is defined between a minimum thickness value to a maximum thickness value as a function of increasing size of the active light area. For example, the minimum thickness value may be at least 100 nm at the design bending radius of 3 cm for a first active light area, and may be greater for the same bending radius of 3 cm for a second, larger active light area.

The present invention also encompasses any manner of flexible OLED lighting device made in accordance with the methods discussed above. An exemplary OLED device may include a flexible planar substrate, and a plurality of OLED elements formed on the substrate, with the substrate and OLED elements having an active light, which may be 50 $cm^2$ or greater in certain embodiments. The active light area has a bend configuration with a design bending radius of 3 cm or greater. The cathode layer has a thickness between 100 nm and less than 500 nm that is determined as a function of the size of the active light area and the design bending radius.

In a particular embodiment, the flexible OLED device may have an active light area between 50 $cm^2$ and 100 $cm^2$ and a design bending radius between 3 cm and 5 cm. The cathode layer thickness may be between 100 nm at a design bending radius of 3 cm and 500 nm at a design bending radius of 5 cm.

In a further embodiment, the active light area is between 100 $cm^2$ and 200 $cm^2$, and the design bending radius is between 3 cm and 6 cm. The cathode layer thickness may be between 200 nm at the design bending radius of 3 cm and 500 nm at the design bending radius of 6 cm.

In still another embodiment, the active light area is between 200 $cm^2$ and 500 $cm^2$, and the design bending radius is between 4 cm and 8 cm. The cathode layer thickness may be between 300 nm at the design bending radius of 4 cm and 500 nm at the design bending radius of 6 cm.

In yet another embodiment, the active light area is between 500 $cm^2$ and 1000 $cm^2$, and the design bending radius is between 5 cm and 10 cm. The cathode layer thickness may be between 400 nm at the bending radius of 5 cm and 500 nm at the bending radius of 10 cm.

The protective cover may, in certain embodiments, have a thickness of less than 1 micron for small area devices (generally less than 200 $cm^2$) less than 10 microns for large area devices. The cover may be formed from a metal, polymer, multi-layer or composite material, and the like.

In a unique embodiment, the cathode layer may be formed by two conductive metallic layers, wherein the metallic layer that is placed in compression at the design bend configuration has a greater rigidity modulus (GPa) than the metallic layer placed in tension. In certain embodiments, at least one of the metallic layers is aluminum or and aluminum alloy.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 is a front planar view of an exemplary OLED lighting device;

FIG. 2 is a perspective view of the OLED lighting device of FIG. 1 in a first bend configuration;

FIG. 3 is a perspective view of the OLED lighting device of FIG. 1 in a second bend configuration;

FIG. 4 is a cross-sectional view of an exemplary OLED lighting device;

FIG. 5 is a cross-sectional view of an alternative exemplary OLED lighting device;

FIG. 6 is a graph illustrating a relationship of cathode layer thickness and bending radius for OLED lighting devices having an active lighting area in a first range;

FIG. 7 is a graph illustrating a relationship of cathode layer thickness and bending radius for OLED lighting devices having an active lighting area in a second range;

FIG. 8 is a graph illustrating a relationship of cathode layer thickness and bending radius for OLED lighting devices having an active lighting area in a third range; and FIG. 9 is a graph illustrating a relationship of cathode layer thickness and bending radius for OLED lighting devices having an active lighting area in a fourth range.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

It is to be understood that the ranges and limits mentioned herein include all ranges located within the prescribed limits (i.e., sub-ranges). For instance, a range from 100 to 200 also includes ranges from 110 to 150, 170 to 190, 153 to 162, and 145.3 to 149.6. Further, a limit of up to 7 also includes a limit of up to 5, up to 3, and up to 4.5, as well as ranges within the limit, such as from about 1 to 5, and from 3.2 to 6.5.

The term "organic" is used herein to refer to a class of chemical compounds that are comprised of carbon atoms. For example, an "organic polymer" is a polymer that includes carbon atoms in the polymer backbone, but may also include other atoms either in the polymer backbone and/or in side chains extending from the polymer backbone (e.g., oxygen, nitrogen, sulfur, etc.).

FIG. 1 is a top planar view of an exemplary OLED device 10 illustrated as a generally flat, planar member having a width 31 and a length 33. It should be appreciated that the rectangular shape of the OLED device 10 in FIG. 1 is for illustrative purposes only, and that an OLED device 10 in accordance with aspects of the invention may have any desired shape, size, or other configuration.

The OLED device 10 in FIG. 1 includes a plurality of individual OLED devices 14 configured on a suitable substrate 12, which is a pliable, bendable member, such as a metal or plastic sheet member. In the depicted embodiment, the OLED elements 14 are disposed lengthwise across the substrate 12, and each OLED element defines a generally continuous, unbroken light region 26. The OLED elements 14 may be separated by gaps 28, which may be scribe lines that are formed after the deposition process wherein the various material layers deposited on the substrate 12 are separated by laser or other known scribing techniques to define the individual elements 14. The OLED device 10 has an active light area 30 that is defined essentially by the combined surface area of the OLED elements 14, particularly the light regions 26. In this regard, the OLED device 10 is particularly well-suited as a wide-area light source that may be incorporated into any manner of light fixture.

FIGS. 2 and 3 depict an OLED device of the type in FIG. 1 in different bend configurations. In FIG. 2, the substrate 12 (and OLED elements 14 configured thereon) is bent into a semi-cylindrical shape having a bending radius 32 (radius of curvature (R)). In FIG. 3, the substrate 12 is bent into a configuration with a different bending radius 32 that is greater than the bending radius 32 in FIG. 2. It should be readily appreciated from FIGS. 2 and 3 that the bending radius 32 decreases as the degree of bend increases. In other words, less pronounced bends have a larger bending radius 32 as compared to tighter bends. It should also be appreciated that each OLED device 10 has a maximum bend configuration (minimum bending radius 32) beyond which the device should not be bent to prevent irreparable damage (including complete failure of the device 10).

FIG. 4 is a cross-sectional view of an exemplary bottom-emitting OLED device 10, wherein light is emitted through the substrate layer 12, which is formed from a transparent or translucent material. It should be appreciated that an OLED device 10 in accordance with aspects of the invention may also be a top-emitting device wherein light is emitted through the cathode layer 22 and adjacent cover layer 24. A first electrode layer 18 is deposited on the flexible substrate 12. For reference, the electrode layer 18 is designated as the anode layer. For a bottom-emitting device, the anode layer 18 is also transparent. The anode layer 18 generally comprises a material having a low work function value such that a relatively small voltage causes emission of electrons from the anode 18. The anode 18 may comprise, for example, indium tin oxide (ITO), tin oxide, nickel, or gold. The anode 18 may be formed by conventional deposition techniques, such as vapor deposition, sputtering, and so forth.

One or more layers of organic light emitting materials 20 are deposited on the anode 18. A variety of organic light emitting material layers are known and can be used in conjunction with exemplary embodiments of the invention. According to the embodiment shown in FIG. 4, the organic light emitting layer 20 comprises a single layer, and may include, for example, a conjugated polymer which is luminescent, a hole-transporting polymer doped with electron transport molecules and a luminescent material, or an inert polymer doped with hole transporting molecules and a luminescent material. The organic light emitting layer 20 may also comprise an amorphous film of luminescent small organic molecules, which can be doped with other luminescent molecules. According to other embodiments of the invention, the organic light emitting layer 20 may include two or more sub-layers which carry out the functions of hole injection, hole transport, electron injection, electron transport, and luminescence. Only the luminescent layer is required for a functioning device. However, the additional sub-layers generally increase the efficiency with which holes and electrons recombine to produce light. Thus, the organic light emitting layer 20 can comprise sub-layers including, for example, a hole injection sub-layer, a hole transport sub-layer, a luminescent sub-layer, and an electron injection sub-layer. Also, one or more sub-layers may comprise a material that achieves two or more functions such as hole injection, hole transport, electron injection, electron transport, and luminescence.

A cathode layer 22 is deposited on the organic light emitting layer 20 to a thickness 38 by any suitable deposition technique. The cathode layer 22 may comprise, for example, calcium or a metal such as gold, indium, manganese, tin, lead, aluminum, silver, magnesium, or a magnesium/silver alloy. Alternatively, the anode can be made of two layers to enhance electron injection. Examples include a thin inner layer of lithium fluoride (LiF) followed by a thicker outer layer of aluminum or silver, or a thin inner layer of calcium followed by a thicker outer layer of aluminum or silver.

A protective cover 24 may be applied over the cathode layer 22 to a thickness 40 and forms a generally hermetic seal over the underlying layers. This cover may be formed from various suitable materials, including a metalloid (e.g., silicon) or a ceramic (e.g., silicon nitride). In a particular embodiment, the protective cover 24 may incorporate a thermally conductive layer, such as one or more layers of a metal or metal alloy, for example silver, aluminum, tin, copper, steel, and so forth. Alternatively, the protective cover 24 made be formed from a thermally conductive material, such as aluminum nitride.

FIG. 4 depicts an embodiment wherein the anode 18 and light emitting materials 20 are deposited on the substrate 12. The individual OLED elements 14 are defined by "cutting" through these layers (for example in a laser scribing technique), as indicated by the scribe lines 28. The cathode layer 22 is then applied as a common electrode layer over the scribed organic material layer 20, and is thus considered a "high work function" layer in that it must be capable of carrying current for all of the OLED elements 14.

FIG. 5 depicts an embodiment wherein each OLED element 14 is formed on an individual respective OLED substrate 16. The plurality of OLED elements 14 are then deposited on the common substrate 12 with a gap between adjacent elements 14. FIG. 5 also depicts the cathode layer 22 as formed from multiple sub-layers 34, 36, with each layer selected for its particular conductivity, flexibility, or other properties. Like FIG. 4, FIG. 5 also shows the organic material layer 20 with scribe lines 28.

FIGS. 6, 7, 8 and 9 are graphs of certain relationships between cathode thickness (X axis) and design bending radius (Y axis) with respect to various active light region areas. In the embodiment of FIG. 6, the active light area is between 50 $cm^2$ to 100 $cm^2$, as indicated by the stripe 30 in FIG. 6. Thus, FIG. 6 represents an embodiment wherein all of the OLED elements 14 on the substrate 12 define a light source having an active light area 30 in the designated range of from 50 $cm^2$ to 100 $cm^2$. The thickness 38 of the cathode layer 22 may vary from 100 nm to 500 am as a function of the design bending radius 32. For example, at a design bending radius of 3 cm, the cathode thickness may be at least 100 nm. As the bending radius 32 increases, the cathode layer thickness 38 also increases to a maximum value of 500 nm at a design bending radius of 5 cm. Although the relationship is depicted as a linear function in the figures, it should be readily appreciated that this is for illustrative purposes only, and that the increase in cathode layer thickness need not be linear, and may have any increasing profile (e.g. exponential, parabolic, and so forth) between the minimum and maximum thickness values.

FIG. 6 depicts the situation wherein, as the design bending radius 32 increases (and thus the bend is less drastic), the cathode layer 22 may have a greater thickness without increasing the likelihood of fracture or delamination of the cathode layer 22. The increase in cathode thickness is, to an extent, desirable in that the cathode layer 22 also serves as a thermally conductive layer and may alleviate the high temperature stresses induced in the OLED device 10. At a certain thickness, however, the increase may become detrimental in that the increased cathode layer may not be necessary for heat conduction, particularly with smaller active light area devices, and would tend to add to the bending stresses and induce cracking and delamination in the cathode layer 22 or underlying layers. FIG. 6 thus represents a compromise between these concerns. As the design bending radius 32 increases, a certain degree of cathode layer thickness increase is desirable up to a maximum thickness, for example of 500 nm for a design bending radius of 5 cm. The cathode layer thickness may be held the maximum thickness for further increases of the design bending radius.

FIG. 7 depicts an embodiment for an OLED device having an active light area 30 of between 100 cm$^2$ to 200 cm$^2$. A device within this active light area range may have a design bend radius 32 of between 3 cm and 5 cm, as depicted in FIG. 7. The cathode layer thickness, however, differs from the embodiment depicted in FIG. 6 because of the increased active light area. For example, referring to FIG. 7, an OLED device having an active light area of, for example, 150 cm$^2$ and a design radius of 3 cm should have a minimum thickness of 200 nm. The cathode layer thickness increases to a maximum of 500 nm at a design bending radius of 6 cm. The cathode layer thickness is thus defined as a function of the increased size of the active light area as compared to the embodiment depicted in FIG. 6. The OLED devices not only generate heat, but operate in a high temperature environment. As the active light area increases, the overall temperature of the environment in which the device operates also increases, regardless of the thermal conductivity of the cathode layers. Thus, FIG. 7 represents the desire to have a relatively thicker cathode layer up to the maximum thickness of 500 nm for an increase in active light area.

FIG. 8 is similar to FIG. 7 and depicts an embodiment wherein the active light area 30 is between 200 cm$^2$ to 500 cm$^2$. In this range, the OLED device has a cathode layer thickness of 300 nm at a design bending radius of 4 cm. A bend configuration that exceeds this design bend radius (i.e. a design bend radius of less than 4 cm) with a cathode layer thickness of 300 nm may likely result in damage to the OLED device, such as delamination of the layers. The cathode layer thickness increases to 500 nm at a bend radius of 8 cm.

FIG. 9 depicts the relationship for an OLED device having an active light area 30 of between 500 cm$^2$ to 1000 cm$^2$. At a bend radius of 5, the device should have a cathode layer thickness of 400 nm, which increases to 500 nm at a design bend radius of 9 cm.

It should be appreciated from a comparison of, for example, FIGS. 9 and 6 that the size of the active light area 30 determines the design bend radius for the OLED device while maintaining a cathode layer thickness desired for reducing heat stresses on the device. An OLED device having an active light area of, for example, 1000 cm$^2$ or greater should not be bent to a design bend radius of 3 cm, as would be possible with the device depicted in FIG. 6.

The protective cover (FIGS. 4 and 5) serves various functions, including overall protection of the underlying material layers, particularly the cathode layer 22. However, the protective layer 24 also adds to the overall thickness of the device, and thus the induced bending stresses in a bendable OLED device. In this regard, the protective cover 24 preferably has a thickness 40 of less than 100 microns, and less than 10 microns in certain embodiments. Desirably, the protective cover may be formed form a thermally conductive material. It may be that the cathode layer thickness 38 can be reduced if combined with a protective cover 24 that also serves as a thermally conductive layer. Non-limiting examples of suitable protective cover materials are provided below in Table 1:

TABLE 1

| Material | Rigidity modulus (GPa) | Coefficient of thermal expansion ($*10^{-6}$/K) |
| --- | --- | --- |
| Al | 26 | 23.1 |
| Bi | 12 | 13.4 |
| Mo | 20 | 4.8 |
| Zn | 43 | 30.2 |
| Tb | 22 | 10.3 |
| Ag | 30 | 18.9 |
| Polybenzimidazole (PBI) (halogen doped); PET; PEN; polyamide; Composite polymer; Filled polymers (e.g., BN graphite filled); graphite enforced elastomer | <10 | <0.1 |

In addition to the above, the protective cover layer may also include other types of high-strength crystalline polymer fibers, such as polyethylene (a non-limiting example of which is Ultra-High Molecular Weight Polyethylene (UHMwPE) sold under the brand name DYNEEMA®) and polybenzobisoxazole (a non-limiting example of which is poly(p-phenylene-2,6-benzobisoxazole)(PBO) sold under the brand name ZYLON®), which materials have a negative coefficient of thermal expansion. These materials actually shrink with increasing temperature, and may be useful in high temperature environments in that they will shrink and provide a more secure protective layer to the underlying cathode.

In the embodiment of FIG. 5, the cathode layer is defined by a first metallic layer 34 and a second metallic layer 36. These layers may be formed of different metals or metal alloys having similar electrical conductivity properties and different hardness properties. When the OLED device is bent, one of the layers 34, 36 is placed in compression while the other layer is placed in tension, depending on their orientation with respect to the bend. It may be desired to select the metallic layers 34, 36 such that the layer that will be placed in compression at the design bend configuration of the OLED device has a greater rigidity modulus (GPa) than the other metallic layer that is placed in tension. This combination may serve to relieve the bending stresses induced in the cathode layer upon configuration of the OLED device into its designed shape, thus providing for an increased cathode layer thickness (for better heat management) while limiting potential delamination at increased bending of the device.

As discussed above, it should be appreciated that the present invention also encompasses any manner of flexible OLED lighting device 10 incorporating aspects of the invention as discussed herein.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method, comprising:
forming a plurality of OLED elements on a flexible planar substrate, wherein at least one of the OLED elements comprises:
a continuous respective anode layer formed over the substrate;
one or more organic light emitting materials formed over the anode layer;
a cathode layer formed over the light emitting materials;
an encapsulating protective cover formed over the cathode layer; and
at least one of the OLED elements defining a continuous light region on the substrate, wherein the substrate and combination of OLED elements define an active light area;
wherein the active light area is bendable from a flat planar configuration to a bend configuration having a design bending radius; and
forming a thickness for the cathode layer between a minimum thickness value and a maximum thickness value as a function of size of the active light area and the design bending radius.

2. The method of claim 1, wherein for a given size of the active light area, the cathode layer thickness is defined between a minimum thickness value at a maximum bend configuration and a maximum value as a function of increasing design bending radius.

3. The method of claim 2, wherein the maximum thickness value is less than 500 nm.

4. The method of claim 2, wherein the minimum thickness value is at least 100 nm.

5. The method of claim 4, wherein the bending radius is 3 cm at the maximum bend configuration.

6. The method of claim 1, wherein for a given design bending radius of curvature of 3 cm or greater, the cathode layer thickness is defined between a minimum thickness value to a maximum thickness value as a function of increasing size of the active light area.

7. The method of claim 6, wherein the minimum thickness value is at least 100 nm.

8. The method of claim 6, wherein the maximum thickness value is less than 500 nm.

9. A flexible OLED lighting device, comprising:
a flexible planar substrate;
a plurality of OLED elements formed on said substrate, wherein at least one of the plurality of OLED elements comprises:
a continuous respective anode layer formed over said substrate;
one or more organic light emitting materials formed over said anode layer;
a cathode layer formed over said light emitting materials;
an encapsulating protective cover formed over said cathode layer;
at least one of the plurality of OLED elements defining a continuous light region on said substrate;
wherein the flexible substrate and the plurality of OLED elements comprise an active light area;
said active light area having a bend configuration with a design bending radius of 3 cm or greater; and
wherein the cathode layer has a thickness between 100 nm and less than 500 nm that is determined as a function of size of the active light area and the design bending radius.

10. The flexible OLED device of claim 9, wherein the active light area is between 50 $cm^2$ and 100 $cm^2$, the design bending radius is between 3 cm and 5 cm, and said cathode layer has a thickness of between 100 nm at the design bending radius of 3 cm and 500 nm at said design bending radius of 5 cm.

11. The flexible OLED device of claim 9, wherein the active light area is between 100 $cm^2$ and 200 $cm^2$, the design bending radius is between 3 cm and 6 cm, and the cathode layer has a thickness of between 200 nm at the design bending radius of 3 cm and 500 nm at the design bending radius of 6 cm.

12. The flexible OLED device of claim 9, wherein the active light area is between 200 $cm^2$ and 500 $cm^2$, the design bending radius is between 4 cm and 8 cm, and the cathode layer has a thickness of between 300 nm at the design bending radius of 4 cm and 500 nm at the design bending radius of 6 cm.

13. The flexible OLED device of claim 9, wherein the active light area is between 500 $cm^2$ and 1000 $cm^2$, the design bend configuration has a design bend configuration between a bending radius of 5 cm and 10 cm, and the cathode layer has a thickness of between 400 nm at the bending radius of 5 cm and 500 nm at said bending radius of 10 cm.

14. The flexible OLED device of claim 9, wherein the active light area is less than 200 $cm^2$ and the protective cover has a thickness of less than 1 micron.

15. The flexible OLED device of claim 14, wherein the protective cover is formed from any one or combination of a metal, polymer, or multi-layer structure.

16. The flexible OLED device of claim 15, wherein the protective cover is formed with a material having a negative co-efficient of thermal expansion.

17. The flexible OLED device of claim 9, wherein the active light area is greater than 200 $cm^2$ and the protective cover has a thickness of less than 100 microns.

18. The flexible OLED device of claim 9, wherein the cathode layer is formed by two conductive metallic layers, wherein the metallic layer placed in compression at said design bend configuration has a greater rigidity modulus (GPa) than the metallic layer placed in tension.

19. The flexible OLED device of claim 18, wherein at least one of the metallic layers is aluminum or an aluminum alloy.

* * * * *